US009904608B2

(12) United States Patent
Garcia

(10) Patent No.: US 9,904,608 B2
(45) Date of Patent: Feb. 27, 2018

(54) FILTERING EVENT LOG ENTRIES

(71) Applicant: International Business Machines Corporation, Armonk, NY (US)

(72) Inventor: Enrique Q. Garcia, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 14/948,677

(22) Filed: Nov. 23, 2015

(65) Prior Publication Data

US 2016/0077931 A1    Mar. 17, 2016

Related U.S. Application Data

(63) Continuation of application No. 13/915,991, filed on Jun. 12, 2013, now Pat. No. 9,231,595.

(51) Int. Cl.
  *G06F 11/00* (2006.01)
  *G06F 11/14* (2006.01)
  (Continued)

(52) U.S. Cl.
  CPC ...... *G06F 11/1471* (2013.01); *G06F 11/0772* (2013.01); *G06F 11/1451* (2013.01);
  (Continued)

(58) Field of Classification Search
  CPC ............. G06F 11/1772; G06F 11/0736; G06F 11/0766; G06F 11/0787; G06F 11/079;
  (Continued)

(56) References Cited

U.S. PATENT DOCUMENTS 5,777,489 A    7/1998  Barbier et al.
5,805,503 A *  9/1998  Camarota ........ H03K 19/17704
                                                365/189.05

(Continued)

FOREIGN PATENT DOCUMENTS

EP    0955583     11/1999
JP    60235252    11/1985

OTHER PUBLICATIONS

Sorin et al., "SafetyNet: Improving the Availability of Shared Memory Multiprocessors with Global Checkpoint/Recovery", May 25, 2002, Copyright 2002 IEEE. Reprinted from Proceedings of the 29th Annual International Symposium on Computer Architecture, 2002, May 2002, pp. 123-134.

*Primary Examiner* — Marc Duncan
(74) *Attorney, Agent, or Firm* — David Zwick

(57) ABSTRACT

Efficient logging in a control system. Register update requests to store data values in one or more of a plurality of primary registers are received. The most frequently updated primary registers of the plurality of primary registers are periodically identifying. A shadow register is associated with each of the identified most frequently updated primary registers. In response to receiving a register update request to store a data value in one of the most frequently updated primary registers, it is determined if the data value to store is different than the data value stored in the shadow register associated with the register to update. If so, the data value to store is stored into the register to update, stored into the shadow register associated with the register to update, and a log entry corresponding to the register update request is stored in an event log file.

13 Claims, 10 Drawing Sheets

(51) Int. Cl.
  *H03K 19/177* (2006.01)
  *G06F 11/07* (2006.01)
  *G06F 11/34* (2006.01)
  *G01R 31/3185* (2006.01)

(52) U.S. Cl.
  CPC ... H03K 19/1776 (2013.01); H03K 19/17764 (2013.01); *G01R 31/318519* (2013.01); *G06F 11/3476* (2013.01); *G06F 2201/835* (2013.01); *G06F 2201/84* (2013.01)

(58) Field of Classification Search
  CPC ............ G06F 11/1451; G06F 11/1471; G06F 11/3476; G06F 2201/835; G06F 2201/84; G01R 31/318519; H03K 19/1776; H03K 19/17764
  See application file for complete search history.

(56) References Cited

U.S. PATENT DOCUMENTS

| | | | |
|---|---|---|---|
| 6,499,113 B1 * | 12/2002 | Tobin | G06F 11/0721 711/112 |
| 6,631,520 B1 | 10/2003 | Theron et al. | |
| 6,671,762 B1 | 12/2003 | Soni et al. | |
| 7,477,070 B2 | 1/2009 | Singh et al. | |
| 8,219,885 B2 * | 7/2012 | Bradley | G06F 11/1004 714/15 |
| 8,234,489 B2 * | 7/2012 | Williamson | G06F 9/30087 713/100 |
| 8,296,775 B2 * | 10/2012 | Thornton | G06F 9/45533 712/228 |
| 8,311,989 B1 | 11/2012 | Morris et al. | |
| 8,319,521 B1 | 11/2012 | Han et al. | |
| 8,914,682 B2 * | 12/2014 | Busch | G06F 11/2215 714/30 |
| 2005/0028171 A1 | 2/2005 | Kougiouris et al. | |
| 2006/0075308 A1 | 4/2006 | Haselden et al. | |
| 2006/0259822 A1 | 11/2006 | Swoboda | |
| 2007/0011492 A1 | 1/2007 | Swaine | |
| 2008/0183944 A1 | 7/2008 | Thornton et al. | |
| 2009/0119302 A1 | 5/2009 | Palmer et al. | |
| 2010/0217945 A1 | 8/2010 | Ge et al. | |
| 2010/0235494 A1 | 9/2010 | Sood et al. | |
| 2011/0010772 A1 | 1/2011 | Small | |
| 2011/0093686 A1 | 4/2011 | Penton et al. | |
| 2011/0202801 A1 | 8/2011 | Horley et al. | |
| 2013/0024466 A1 | 1/2013 | Omiya et al. | |
| 2014/0372426 A1 | 12/2014 | Garcia | |

* cited by examiner

FILTERING EVENT LOG ENTRIES

BACKGROUND

The present invention relates generally to programmable logic devices, and more specifically to programmable logic devices that use event logs for diagnostic purposes.

Field programmable gate arrays (FPGAs) are regular structures of logic modules communicating via an interconnect architecture of lines and switches. A user programs the logic modules and interconnect structures to perform particular functions and realize the FPGA's global function. Because of their programmability in the field, they have been widely used for rapid prototyping or reconfiguration of complex digital systems. There are many types of FPGA, such as RAM-based, EPROM switches or antifuses. Out of these, RAM-based FPGAs are the most popular and widely used.

Some types of FPGAs may be configured to compile all detected errors and other significant events in an event log. When a system controlled by an FPGA is serviced, for example, after some problem or failure, the event log can be examined to help determine the cause of the problem or failure. One standard form of event log is a "circular" event log. Once the event log is full, new events overwrite the oldest events in the log. This does not work well for events that trigger a cascade of error events. If there are enough follow-on events, the trigger event(s) could be discarded and unavailable for diagnoses. The likelihood of unavailable events of interest can be reduced by using event logs with greater capacity. However, FPGA's integrated-circuit real estate is limited so that it is not practical to use an event log that is large enough to store all possible events of interest. Accordingly, conventional FPGAs do not provide a flexible way to capture and retain events of greatest interest at appropriate granularity level.

SUMMARY

Embodiments of the present invention disclose a method, computer program product, and system for efficient logging in a control system. Register update requests to store data values in one or more of a plurality of primary registers are received. The most frequently updated primary registers of the plurality of primary registers are periodically identifying. A shadow register is associated with each of the identified most frequently updated primary registers. In response to receiving a register update request to store a data value in one of the most frequently updated primary registers, it is determined if the data value to store is different than the data value stored in the shadow register associated with the register to update. In response to determining that the data value to store is different than the data value stored in the shadow register associated with the register to update, the data value to store is stored into the register to update, the data value to store is stored into the shadow register associated with the register to update, and a log entry corresponding to the register update request is stored in an event log file.

In another aspect, in response to determining that the data value to store is not different than the data value stored in the shadow register associated with the register to update, the data value to store is not stored into the register to update, the data value to store is not stored into the shadow register associated with the register to update, and a log entry in the event log file is not stored corresponding to the register update request.

In another aspect, in response to receiving a register update request to store a data value in a primary register that is not one of the most frequently updated primary registers, the data value to store is stored into the register to update, a log entry in the event log file is stored corresponding to the register update request.

DETAILED DESCRIPTION

Embodiments of the present invention will now be described with reference to the figures. Embodiments of the present invention apply equally to all forms of control systems that capture data events internally in an event log structure having limited logging capability. However, focus is directed to uninterruptable power supply (UPS) control systems by means of example and explanation in the description of embodiments of the present invention.

Embodiments of the present invention provide an improved event logging scheme. The method of efficient logging in a control system described herein provides flexibility, by maintaining shadow copies of values stored in frequently accessed primary registers and by logging only events of greatest interest in an event log file.

Figure 1:
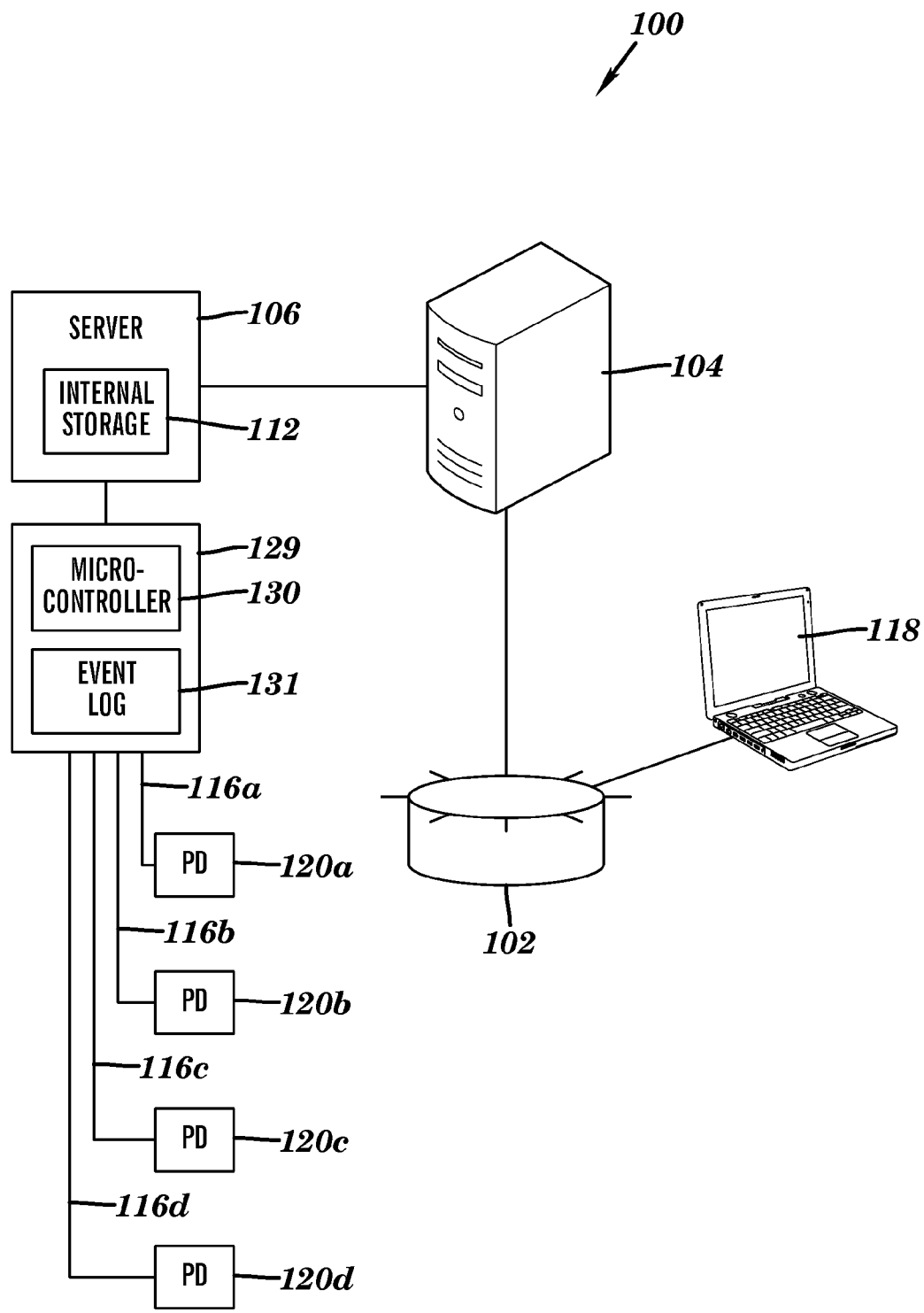
FIG. 1 is a conceptual block diagram of a sample computer environment in which an embodiment of the present invention can be implemented.

FIG. 1 is a conceptual block diagram of a sample computer environment 100 in which an embodiment of the present invention can be implemented. FIG. 1 is an illustration of one implementation and is not intended to imply any limitation with regard to the environments in which different embodiments may be implemented. Many modifications to the depicted environment 100 may be made.

In one embodiment network 102 can be the Internet which uses the TCP/IP suite of protocols. Network 102 may also comprise a number of different types of networks, such as an intranet, a local area network (LAN), a wide area network (WAN), wireless local area network (WLAN), synchronous optical network (SONET), and the like.

Network 102 provides communication links between various devices and computers. Network 102 may include connections, such as wire, wireless communication links, fiber optic cables, or any other connection technology known in the art. Network 102 may include additional server computers, client computers, displays and other devices not shown.

Exemplary computer environment 100 comprises server computer 104 coupled to client computer 118 via network 102. Server computer 104 may be a mainframe computer, a workstation, a personal computer, and the like. Server computer 104 may be configured to communicate with a plurality of peripheral devices 120a-120d via server 106. As will be discussed with reference to FIG. 7, server computer 104 includes internal components 800a and external components 900a, server computer 106 includes internal components 800b and external components 900b, and client computer 118 includes internal components 800c and external components 900c. Internal components 800a and 800b of sever computers 104 and 106 include, but not limited to, one or more processors 820 (shown in FIG. 7).

Server computer 106 is configured to control and monitor a sub-system of peripheral devices (PDs) 120a-120d. In FIG. 1, an array including four PDs 120a, 120b, 120c, 120d is shown for illustration, but it should be understood that the PD array may include a greater or lesser number of PDs. Exemplary peripheral devices may include, for example, but not limited to DVD players, CD ROMs, digital cameras, printers, scanners, monitors, and the like. In an embodiment, the sub-system of peripheral devices may include a power-supply sub-system for server 104. Each of PDs 120a-120d may represent a UPS unit. An embedded controller 129 coupled to server 104 controls the overall operation of PDs 120a-120d via, for example, microcontroller program 130. In an embodiment, microcontroller program 130 may be, for example, a computer program or program component configured to control a plurality of PDs 120a-120d. Thus, microcontroller program 130 may, for example, manage the transfer of data to and from the PD array.

In an embodiment, microcontroller program 130 may comprise program instructions stored on one or more computer-readable storage devices, which may include internal storage 112 on server computer 106. Microcontroller program 130 may communicate with PDs 120a-120d via a serial bus or via parallel buses 116a-116d.

Figure 3:
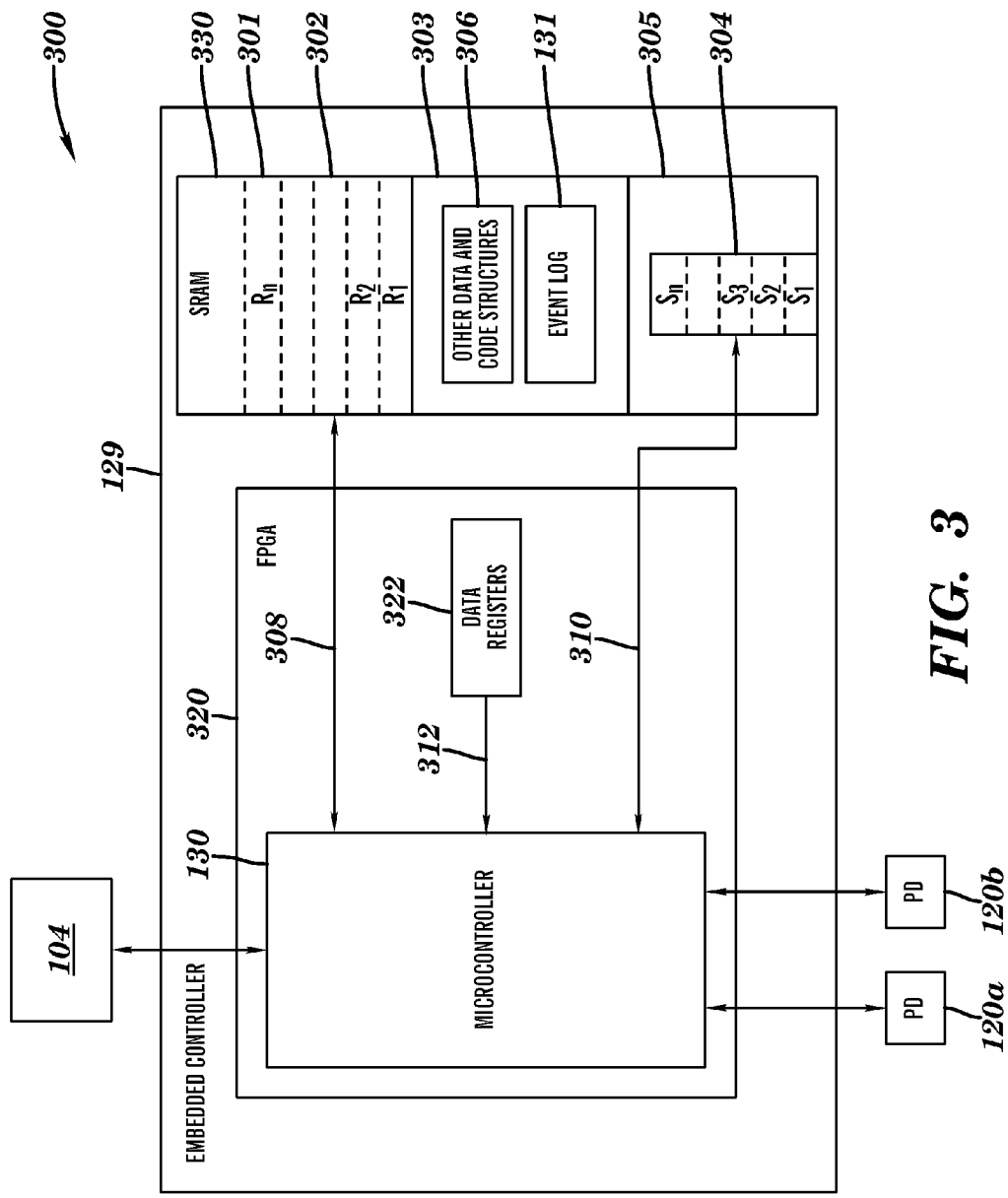
FIG. 3 illustrates operation of the embedded controller illustrated in FIG. 1 in more detail, in accordance with an embodiment of the present invention.
Figure 4:
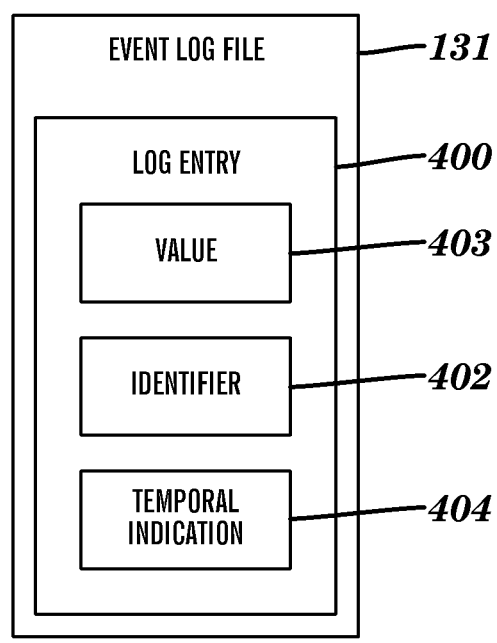
FIG. 4 shows a block diagram of an exemplary event log file structure, in accordance with an embodiment of the present invention.

In an embodiment, microcontroller program 130 may be configured to maintain an event log file 131, as discussed in conjunction with FIGS. 3 and 4. Microcontroller program 130 and event log file 131 may be localized on server 106 and/or distributed between two or more servers.

Client computer 118 also connects to network 102. Client computer 118 may be, for example, a mobile device, telephone, television receiver, cell phone, personal digital assistant, netbook, laptop computer, tablet computer, desktop computer, and/or any type of computing devices capable of executing software in accordance with the embodiments described herein. Client computer 118 may contain a user interface (UI). UI can be, for example, graphical user interface (GUI) or web user interfaces (WUI). Client computer 118 may receive, process, display and/or otherwise exchange data with server 104.

Figure 2:
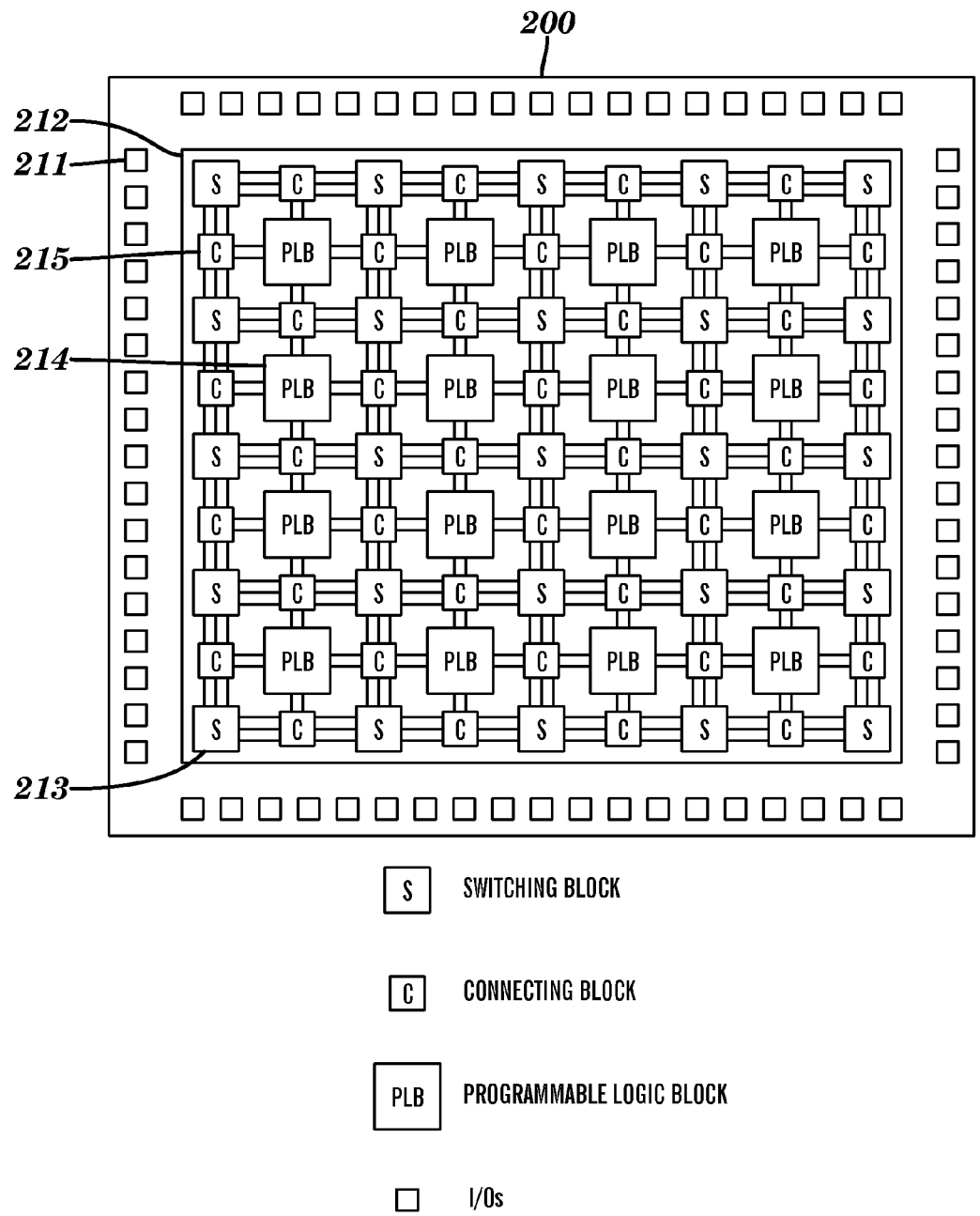
FIG. 2 shows a conventional FPGA that includes programmable logic blocks and interconnect resources.

FIG. 2 illustrates the block diagram of a conventional field programmable gate array (FPGA) 200, which includes an array 212 of programmable logic blocks (PLB) 214 and programmable interconnect resources, such as, switching blocks 213 and connection blocks 215. The programmable interconnect resources 213 and 215 are located within PLB array 212 and extend between the PLBs 214 and 110 blocks (IOBs) 211. PLB array 212 provides functional elements for constructing logic circuits. IOBs 211 provide an interface between the external pins of FPGA 210 and the logic circuit implemented by PLB array 212. The programmable interconnect resources (213 and 215) provide routing paths to connect to PLBs 214 and IOBs 211 onto the desired networks. Customized configuration of FPGA 200 is achieved by programming internal static configuration memory cells that determine the logic functions and interconnections of PLBs 214, IOBs 211 and interconnect resources 213 and 215.

FIG. 3 illustrates operation of the embedded controller illustrated in FIG. 1 in more detail, in accordance with an embodiment of the present invention. The same reference numbers in different drawings identify the same or similar elements. Embodiments of the present invention apply equally to all forms of control systems that capture data events internally in an event log structure having limited logging capability. However, in FIG. 3, focus is directed to a power supply system (i.e. UPS control system) 300 by means of example and explanation in the description of embodiments of the present invention.

Power supply system 300 depicted in FIG. 3 includes an embedded controller 129 that controls and monitors the overall operation of power supply system 300. Embedded controller 129 is operated by microcontroller program 130 that implements the overall purpose of system 300. Thus, microcontroller program 130 enables embedded controller 129 to communicate with a plurality of PDs (UPS devices 120a and 120b). In an embodiment of the present invention, microcontroller program 130 can be implemented by programming a FPGA 320, such as a conventional FPGA 200 shown in FIG. 2. FPGA 320 is an integrated circuit that can be programmed by users to perform customized logic functions. In an embodiment of the present invention, these integrated circuits can be programmed to provide an interface (microcontroller program 130) that controls and monitors PDs 120a-120b and communicates with server 104. As shown in FIG. 3, power supply system 300 has two peripheral devices (PDs) a first PD 120a and a second PD 120b. While FIG. 3 shows only two PDs, some systems may have only one PD while others may have three or more, possibly many more.

As illustrated in FIG. 3, FPGA 320 may also include a plurality of data registers 322. The microcontroller program 130 and data registers 322 can be implemented in a single compact FPGA device 320 (as shown in FIG. 3) or distributed between multiple compact FPGA devices. Data bus 312 may provide a bidirectional communication link between microcontroller program 130 and data registers 322. Data bus 312 may support a variety of communication protocols and standards known in the art, such as, for example, but not limited to RS-485 to support point-to-point and multi-drop bus communication. Data registers 322 may store a variety of configuration parameters, commands, and status information.

In an embodiment of the present invention, embedded controller 129 may also include volatile memory. While the volatile memory may comprise any type of random access memory (RAM), such as static random access memory (SRAM) or dynamic random access memory (DRAM), an embodiment illustrated in FIG. 3 is implemented using an SRAM module 330. However, any appropriate number and type of RAM modules may be used. As shown in FIG. 3, SRAM module 330 may be coupled to the load/store bus 308. Of course, SRAM 330 may be any suitable size and partitioned in any desirable manner. In an embodiment illustrated in FIG. 3, SRAM module 330 may be partitioned to include three different regions.

First SRAM region 301 may be designated as primary data region. In an embodiment, first SRAM region 301 may include a plurality of software controllable primary registers 302, such as, for example, registers $R_1$-$R_n$. Software controllable primary registers 302 may also store a variety of configuration parameters, commands, and status information.

Second SRAM region 303 may be used for general purpose RAM and for logging purposes. As previously indicated, microcontroller program 130 may be configured to maintain all significant events in event log file 131, which may be retained in second SRAM region 303 of the embedded controller's 129 volatile memory. In an embodiment of the present invention, event log file 131 shall contain at least some details about data communication between microcontroller program 130 and the plurality of PD devices 120a, 120b. When power supply system 300 is serviced, for example, after some problem or failure, event log file 131 can be examined to help determine the cause of the problem or failure. One conventional form of event log file 131 is a "circular" event log. Once event log file 131 is full, new events overwrite the oldest events in event log file 131. This does not work well for events that trigger a cascade of error events. If there are enough follow-on events, the trigger event(s) could be discarded and unavailable for diagnoses. The likelihood of unavailable events of interest can be reduced by using event logs with greater capacity. However, embedded controller's 129 integrated-circuit real estate is limited so that it is not practical to use an event log that is large enough to store all possible events of interest. In addition, second SRAM region 303 may be used to store other data and code structures 306.

Third SRAM region 305 may be designated, for example as a shadow data region. According to an embodiment of the present invention, third SRAM region 305 may include a plurality of registers 304, referred to hereinafter as shadow registers, which may duplicate at least some information stored in other registers, such as primary registers 302 or data registers 322. Shadow registers 304 can temporarily store data values for most frequently accessed primary registers 301, as described below. A shadow register may be provided for each primary register identified as a frequently accessed register. According to an embodiment of the present invention, third SRAM region 305 may be coupled to microcontroller 130 via a designated shadow register bus 310.

In an embodiment of the present invention, microcontroller program 130 may include a communication interface (not shown in FIG. 3). The communication interface can perform communication protocol conversion, enabling microcontroller program 130 to read and write values in data registers 322, primary registers 302, and shadow registers 304.

A method of efficient logging described herein provides flexibility, by maintaining temporary shadow copies of data stored in primary registers 302 and data registers 322 and by filtering and recording only changed values in event log file 131, as described below in conjunction with FIG. 5.

Referring now to FIG. 4 showing a block diagram of an exemplary event log file structure, in accordance with an exemplary embodiment of the present invention. Microcontroller program 130 may be configured to maintain all significant events in event log file 131. In some exemplary embodiments, event log file 131 may comprise multiple event entries 400. In some exemplary embodiments, event entry 400 may be a line of text in event log file 131. Event entry 400 may comprise an identifier 402, value 403 and a temporal indication 404. Identifier 402 may stem from an event and may be associated, for example, to a primary register. Value 403 may represent a data value stored, for example, in the identified primary register. Temporal indication 404 may represent a timestamp of the event, according to an embodiment of the present invention.

Figure 5:
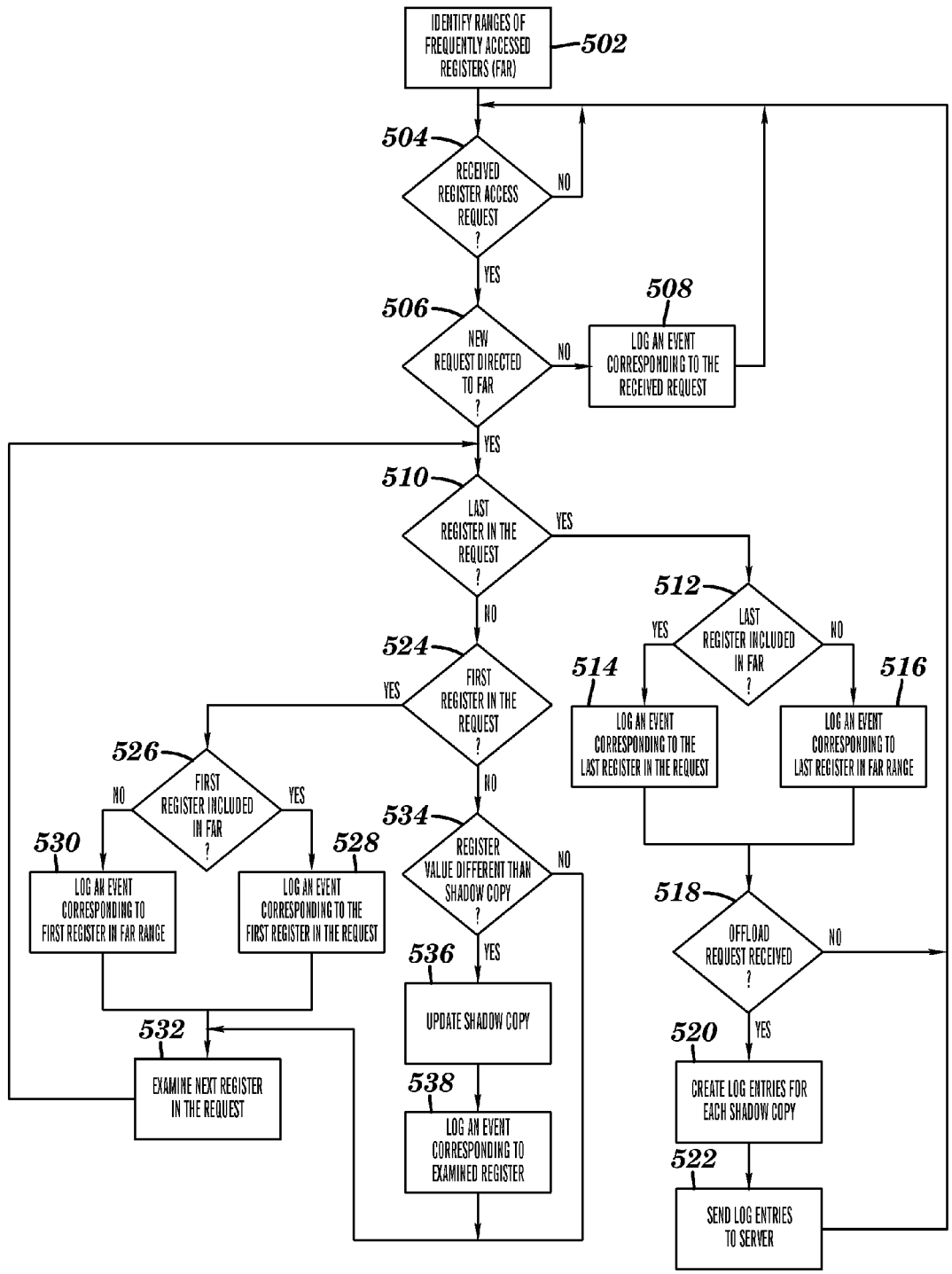
FIG. 5 illustrates in more detail steps performed by the microcontroller program illustrated in FIG. 1 for efficient logging of processed register access requests, according to one embodiment of the present invention.

FIG. 5 illustrates in more detail steps performed by the microcontroller program for efficient logging of processed register access requests, according to one embodiment of the present invention. In an embodiment, microcontroller program 130 may be, for example, a computer program or program component configured to control a plurality of PDs 120a-120d. In various implementations, a fairly large number of registers may be required for support of peripheral devices. Registers may be classified according to the type of data they hold and how it is used. Some examples include data registers, address registers, general purpose registers, floating point registers, instruction registers and index registers. Registers can also be categorized in a number of ways, described more fully below, related to, for example the frequency with which they will be accessed. For simplicity, the term "plurality of registers" as used herein can refer both to a plurality of software controlled primary registers 302 and data registers 322 that are included within FPGA 320 of the embedded controller 129. At 502, microcontroller program 130 may identify one or more ranges of frequently accessed registers (FARs), such as, for example, registers $R_1$-$R_n$ shown in FIG. 3. In an embodiment of the present invention, microcontroller program 130 may determine the most frequently accessed registers, for example, by periodically analyzing performance counters. This category of registers may be managed by microcontroller program 130 in a special manner for event logging purposes, according to an embodiment of the present invention.

During normal operation server 104 may request, for example, status information from microcontroller program 130. In response, microcontroller program 130 may query a PD status and/or make control changes as needed. As a result, microcontroller program 130 may update numerous registers. Embodiments of the present invention recognize that while it would be most desirable to store, in event log file 131, information about events of the greatest interest as well as all register access requests (such as, read requests and write requests) this approach would not be very practical due to the very limited space in second SRAM region 303 for the storing of event entries 400 included in event log file 131. According to an embodiment of the present invention, the communication interface of microcontroller program 130 (not shown in FIG. 3), may break up the communication packets exchanged with server 104 into data frames. At least some data frames may include register access requests. In an embodiment of the present invention, each register access request may include, for example, a plurality of register addresses and a corresponding plurality of data values to be stored at the specified register addresses. At 504, microcontroller program 130 may periodically check the communication interface to determine whether any new register access requests have been received. If microcontroller program 130 determines that no new register access requests have been received (decision 504, no branch), microcontroller program 130 may check again after a predetermined period of time. In an embodiment, this predetermined period of time may range from approximately 1 ms to approximately 20 ms. If microcontroller program 130 determines that a new request has been received (decision 504, yes branch), microcontroller program 130, at 506, may evaluate the received register access request to determine whether the newly received request is directed to one or more registers categorized as FAR (at 502). For example, microcontroller program 130 may evaluate the register addresses included in the newly received request and compare them with register addresses identified at 502.

According to an exemplary embodiment of the present invention, register access requests may be filtered out based on various register categorizations. In other words, the filtering scheme may be associated, for example, only with register access requests addressed to a subset of the FARs. Therefore, if microcontroller program 130 determines that the newly received request is not addressed to any of the FARs (decision 506, no branch), at 508, microcontroller program 130 may generate a corresponding event entry in the event log file 131.

Figure 6A:
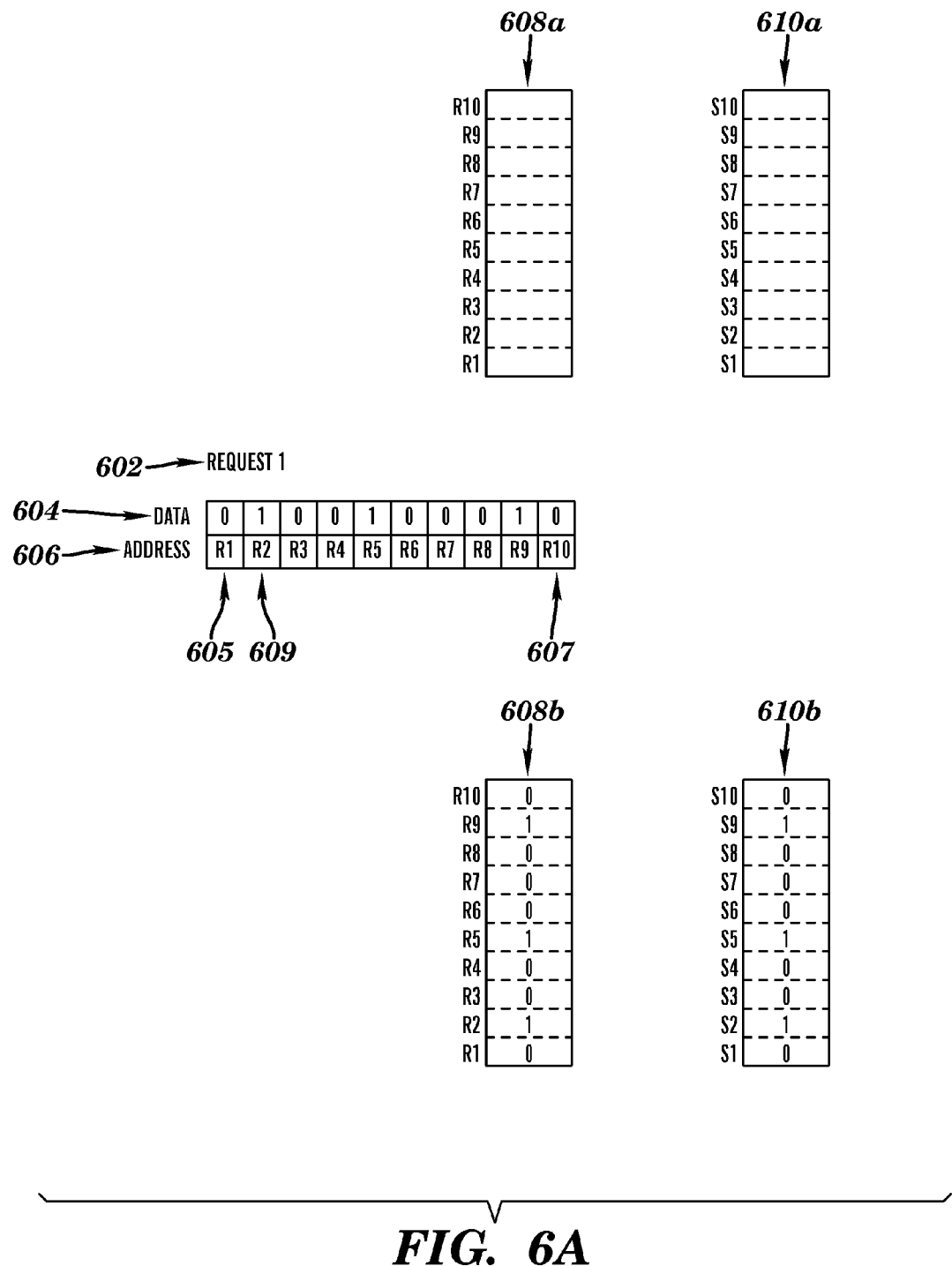
FIGS. 6A-6D are conceptual block diagrams illustrating how the microcontroller program illustrated in FIG. 1 processes incoming register access requests, according to an embodiment of the present invention.

On the other hand, in response to determining that the newly received request includes at least one FAR (decision 506, yes branch), at 510, microcontroller program 130 may start evaluating register addresses included in the request one by one. For instance, FIG. 6A illustrates an exemplary register access request (first request 602) that may be received by microcontroller program 130. This request 602 may include a plurality of register addresses 606 and a corresponding plurality of data values 604 to be stored at the specified addresses 606. The plurality of addresses may include first register address 605 and last register address 607. Thus, at 510, microcontroller program 130 may try to determine whether it has reached the last register address (i.e. last register address 607 in request 602).

If microcontroller program 130 determines that it has not reached the last register in the request yet (decision 510, no branch), microcontroller program 130, at 524, may next check whether it is currently evaluating a first register in the received request (i.e. first register address 605 in request 602). According to an embodiment of the present invention, an event entry corresponding to the first FAR and last FAR of each request should always be generated. Therefore, in response to determining that the first register of the received request is being evaluated (decision 524, yes branch), microcontroller program 130 may determine next, at 526, whether the first register address of the request is included in the identified plurality of FARs. According to an embodiment of the present invention, if the first register address in the request is a FAR (decision 526, yes branch), microcontroller program 130, at 528, may generate a log entry 400 corresponding to the first register address in the received request. Such log entry may include an identifier 402, such as a register identifier (e.g., $R_1$ in request 602), a corresponding value 403 that will be stored in the specified register and temporal indication 404, such as timestamp. However, if microcontroller program 130 determines that the first register in the request is not a FAR (decision 526, no branch), according to an embodiment of the present invention, microcontroller program 130 may generate log entry 400 corresponding to the first register in the identified FAR range, instead of the first register in the received request, at 530. As previously indicated, all log entries 400 generated by the microcontroller program 130 may include identifier 402, value 403 and temporal indication 404. These entries may be stored in the event log file 131.

Subsequently to generation of the log entry 400, either at 528 or at 530, microcontroller program 130 may continue examining registers included in the received request at 532. For example, continuing with an exemplary request 602 shown in FIG. 6A, after generating log entry 400 corresponding to first register 605, microcontroller program 130 may examine second register 609 of the request 602 and may return to decision block 510. At 510 and at 524 microcontroller program 130 may again evaluate whether the examined register (i.e. second register 609) comprises either the first or the last register included in the request. In response to determining that the currently examined register is neither the last register (decision 510, no branch) nor the first register (decision 524, no branch) of the received request, at 534, microcontroller program 130 may compare the data value to be stored in the currently evaluated register with a value stored in the corresponding shadow register.

Embodiments of the present invention contemplate that once microcontroller program 130 identifies one or more ranges (pluralities) of FARs, such as $R_1$-$R_n$ in first SRAM region 301 microcontroller program 130 may allocate a corresponding plurality of shadow registers, such as $S_1$-$S_n$ in third SRAM region 305. Microcontroller program 130 may use shadow registers 304 to store shadow copies of values stored in primary registers 302. For example, primary register $R_1$ may be associated with shadow register $S_1$, primary register $R_2$ may be associated with the shadow register $S_2$ (and so forth). Accordingly, at 534, microcontroller program 130 may compare the value specified in the received request to be stored at the currently examined register address with the contents of the corresponding register in the plurality of shadow registers 304. In response to determining that the value stored in the shadow register is different from the value specified in the received request (decision 534, yes branch), microcontroller program 130 may replace the contents of the corresponding shadow register 304 with the value specified in the request. Continuing with the exemplary request 602 shown in FIG. 6A, assuming that microcontroller program 130 currently examines second register $R_2$ 609 included in request 602, if the corresponding value in $S_2$ does not match the data value specified to be stored in the examined (second) register 609, i.e. the value=1, microcontroller program 130 may update the content of register $S_2$ in accordance with an embodiment of the present invention. Furthermore, since the copy stored in the shadow register 304 differs from the value specified in the request, at 538, microcontroller program may generate a log entry 400 corresponding to the newly examined register. Subsequently, at 532, microcontroller program 130 may examine next register (e.g. third) included in the request and return back to decision 510. In response to determining that the value stored in the shadow register matches the value specified in the received request (decision 534, no branch), microcontroller program 130 may skip actions specified at 536 and 538 and may examine next register included in the request, at 532. In other words, at 534-538, microcontroller program 130 identifies a subset of the plurality of registers included in the received request. This subset contains only registers having data values different from the previous value stored in a corresponding shadow register 304. In accordance with an embodiment of the present invention, microcontroller program 130 generates a log entry 400 only for those registers included in the subset described above.

Next, microcontroller program 130 may continue examining registers in the received request in accordance with an aspect of an exemplary embodiment described above until microcontroller program 130 reaches last register in the request. Register $R_{10}$ 607 represents last register in the request 602. In response to determining that the last register of the received request is being evaluated (decision 510, yes branch), microcontroller program 130 may determine next, at 512, whether the last register address of the request is included in the identified plurality of FARs. According to an embodiment of the present invention, if the last register address in the request is a FAR (decision 512, yes branch), microcontroller program 130, at 514, may generate log entry 400 corresponding to the last register address in the received request. Such log entry may include identifier 402, such as a register identifier (e.g., $R_{10}$ in request 602), corresponding value 403 that will be stored in the specified register and temporal indication 404, such as timestamp. However, if microcontroller program 130 determines that the last register in the request is not a FAR (decision 512, no branch), according to an embodiment of the present invention, microcontroller program 130 may generate log entry 400 corresponding to the last register in the identified FAR range, instead of the last register in the received request, at 516. This aspect of various embodiments of the present invention will be illustrated below in conjunction with FIG. 6C.

Embodiments of the present invention contemplate that server 104 may send a log file offload request command to microcontroller program 130 interleaved among other control commands. In response to receiving the offload request, microcontroller program 130 may transfer the contents of the log file 131 to server 104. Accordingly, after evaluating the last register included in the processed request, microcontroller program 130 may try to determine whether a new offload request has been received from server 104, at 518. In response to determining that server 104 has not placed such request (decision 518, no branch), microcontroller program 130 may wait for next register access request at 504. However, in response to determining that a new event log file offload request has been received (decision 518, yes branch), at 520, microcontroller program 130 may create a log entry for each value stored in the plurality of shadow registers 304. This aspect of the illustrative embodiment addresses a limitation imposed by the event log file's 131 depth. If event log file 131 has wrapped since the last time a register was updated (and logged), then at the time of the offload, the lack of a log entry for a specific register indicates that it had not been updated during the scope of the event log file 131, and the generation of log entries 400 for each shadow copy register 304 made at offload time may be the way to ascertain the present value of the specific register. At 522, responsive to the received offload request, microcontroller program 130 may transmit the generated log entries 400 to server 104. Upon completing this transmission, microcontroller program 130 may return to waiting for next register access request, at 504.

In summary, a method of efficient logging described herein provides flexibility, by identifying a first plurality of registers (FARs) based on a frequency of requests to access data values stored in a plurality of primary registers 302 and data registers 322. The method further includes receiving, at 504, from server 104, a request to access at least one of the FARs. According to an embodiment, the request (i.e. request 602 shown in FIG. 6A) may include a first register address (i.e. $R_1$ 605), a first data value to be stored at the first register address, a last register address (i.e. $R_{10}$ 607), a second data value to be stored at the last register address and a plurality of data values to be stored in a second plurality of registers (i.e. $R_1, R_2, \ldots, R_{10}$). The method further includes identifying a third plurality of registers based at least in part on predetermined criteria for inclusion into the third plurality of registers (at 510, 512, 524, 526 and 534). The third plurality of registers represents a subset of FARs which may include the first and last registers from the received request, as well as FARs included in the request having data values different from the data values stored in the corresponding shadow registers 304. The method further includes storing, in event log file 131, log entry 400 corresponding to each data value in the third plurality of registers (e.g., at 514, 516, 528, 530, and 538).

FIGS. 6A-6D are conceptual block diagrams illustrating how the microcontroller program illustrated in FIG. 1 processes incoming register access requests, according to an embodiment of the present invention. These drawings are expressly related to an embodiment of this invention and provide illustrated examples that are not intended to limit this invention.

Figure 6B:
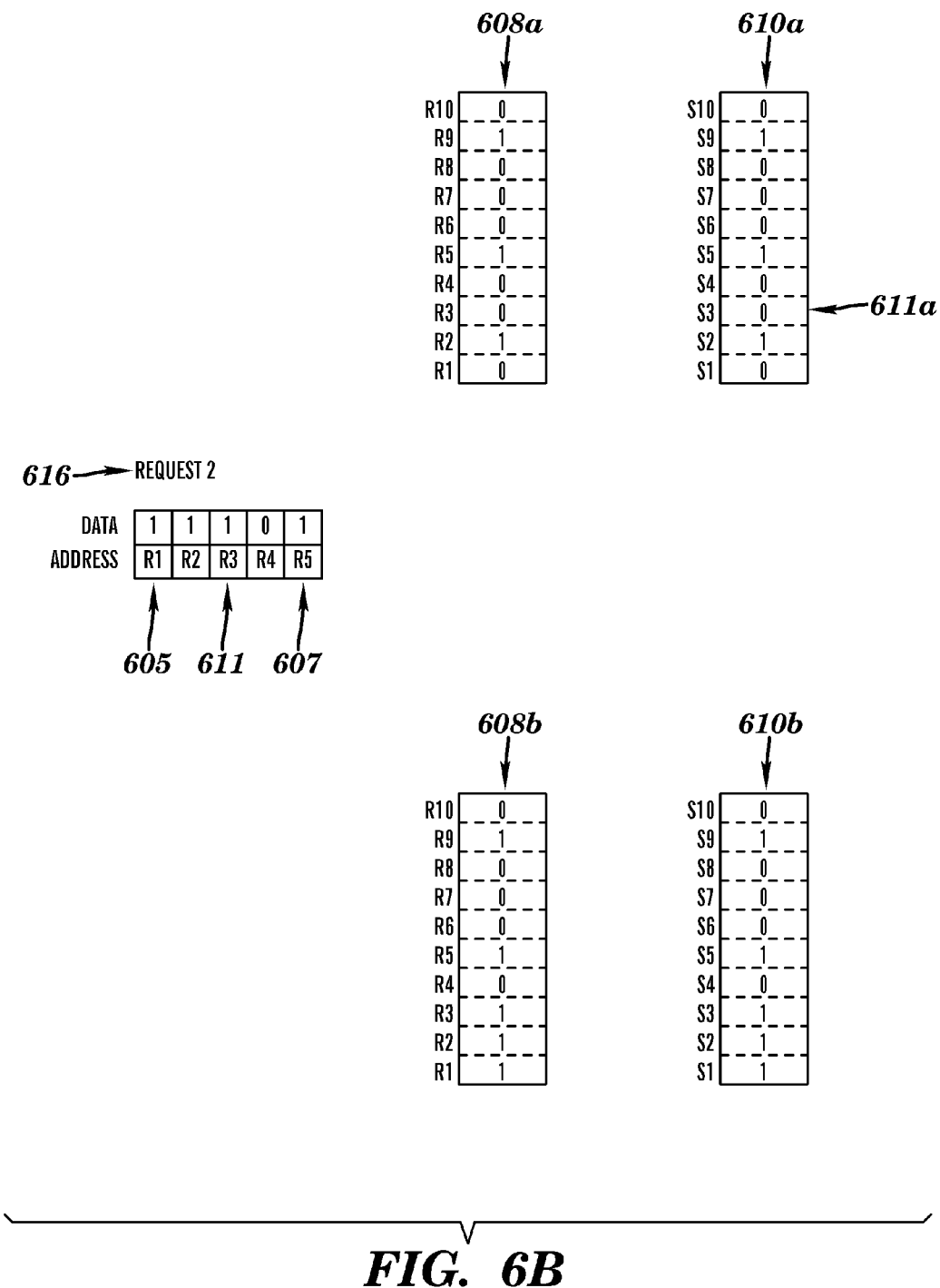

For illustrative purposes assume that microcontroller program 130 has identified one range of FARs 608a, specifically $R_1$-$R_{10}$. When microcontroller program 130 receives first request 602, both the plurality of FARs 608a and the plurality of associated shadow registers $S_1$-$S_{10}$ 610a may be empty, as shown in FIG. 6A. The received request 602 may include a plurality of register addresses 606 and corresponding plurality of data values 604. The plurality of register addresses may include first register address 605 and last register address 607. After microcontroller processor 130 performs steps described above in conjunction with FIG. 5 to evaluate each register included in first request 602, microcontroller program 130 may update data values in both FARs 608b and shadow registers 610b with data values 604 included in first request 602. According to an embodiment of the present invention, microcontroller program 130 may generate log entry 400 for each of the register addresses 606 included in the first request 602, since each of these registers are accessed for the first time and since values are different from the values stored in shadow registers 610a prior to reception of the first request 602, as shown in FIG. 6A FIG. 6B illustrates contents of FARs 608a and corresponding shadow registers 610a prior to receiving second register access request 616. FIG. 6B also illustrates contents of FARs 608b and corresponding shadow registers 610b after microcontroller program 130 processes second register access request 616. This exemplary second request 616 may include a plurality of consecutive registers between $R_1$ (first register 605) and $R_5$ (last register 607). According to an embodiment of the present invention, in response to receiving second request 616, microcontroller program 130 may generate log entries 400 only for registers $R_1$ (as first register 605 of second request 616), $R_5$ (as last register 607 of second register 616), and $R_3$. Microcontroller program 130 may generate log entry 400 corresponding to register $R_3$ because data value corresponding to register $R_3$ 611 in second request 616 is different from the value stored in the corresponding shadow register $S_3$ 611a, as explained above in conjunction with FIG. 5 (see 534-538).

Figure 6C:
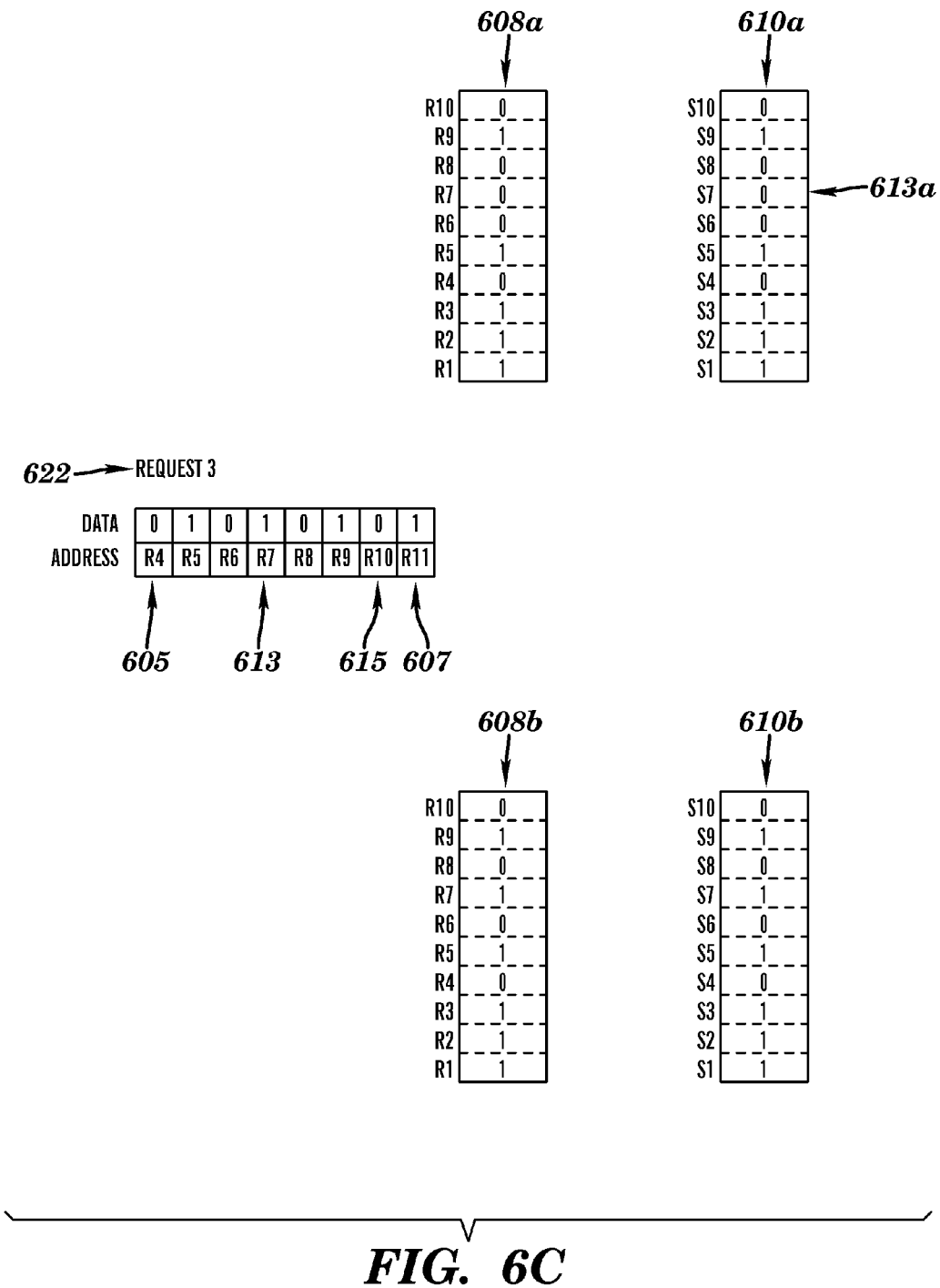

FIG. 6C illustrates contents of FARs 608a and corresponding shadow registers 610a prior to receiving third register access request 622. FIG. 6C also illustrates contents of FARs 608b and corresponding shadow registers 610b after microcontroller program 130 processes third register access request 622. Third register access request 622 may include a plurality of consecutive registers between $R_4$ (first register 605) and $R_{11}$ (last register 607). According to an embodiment of the present invention, in response to receiving third request 622, microcontroller program 130 may generate log entries 400 only for registers $R_4$ (as first register 605 of third request 616), $R_7$ and $R_{10}$. Microcontroller program 130 may generate log entry 400 corresponding to register $R_7$ 613 because data value corresponding to register $R_7$ 613 in second request 616 is different from the value stored in the corresponding shadow register $S_3$ 611a, as explained above in conjunction with FIG. 5 (see 534-538). Furthermore, since last register 607 included in third request 622 is beyond the range of identified FARs 608a, microcontroller program 130 generates log entry 400 corresponding to last register included in the FAR range (i.e. $R_{10}$ 615), according to an embodiment of the present invention. This aspect is shown at 512-516 of FIG. 5.

Figure 6D:
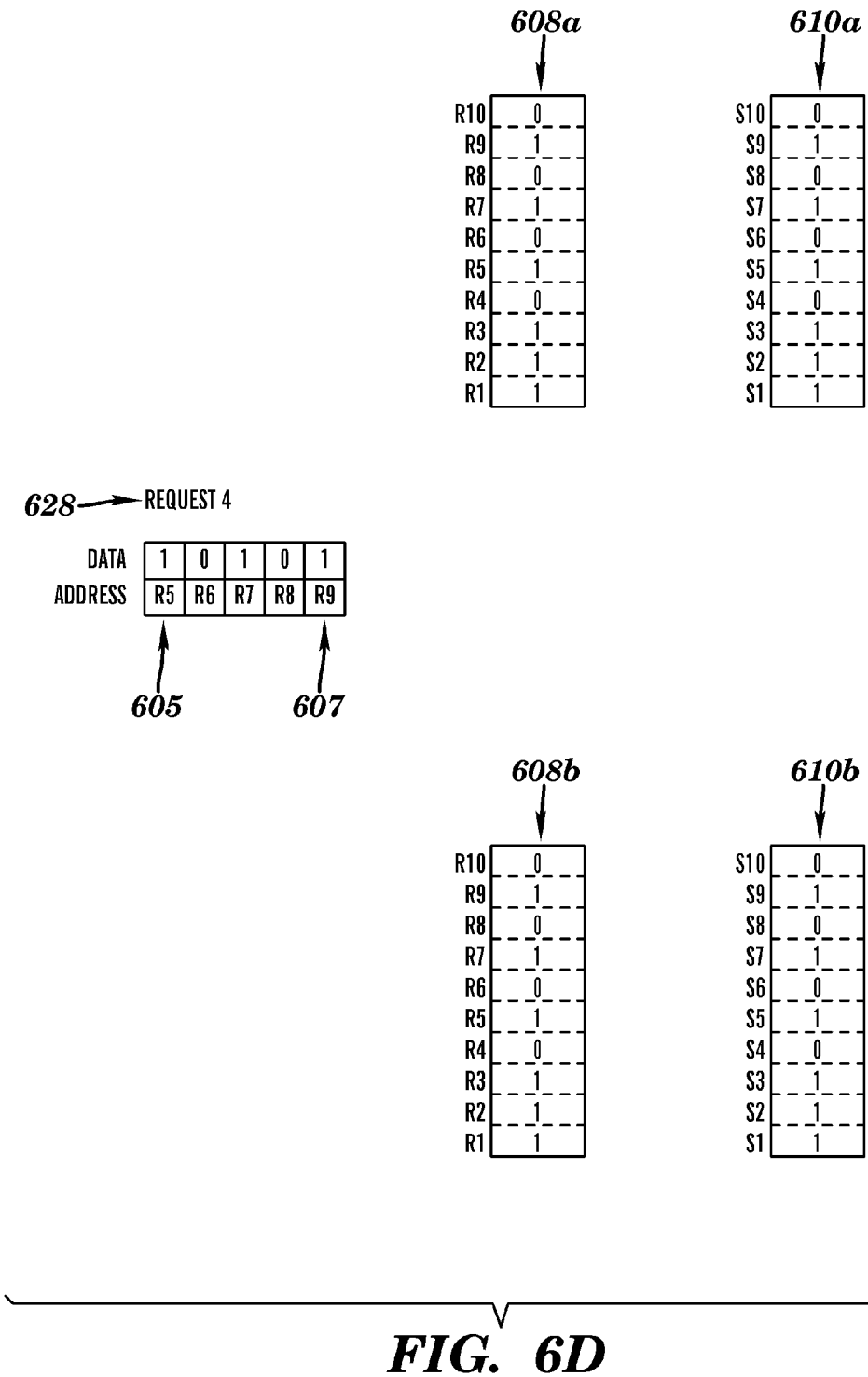

FIG. 6D illustrates an exemplary fourth register access request 628 and contents of FARs 608a, 608b and corresponding shadow registers 610a, 610b both prior to receiving and after processing fourth register access request 628. Even though fourth register access request 628 contains data values that match corresponding data values in shadow registers 610a, according to an embodiment of the present invention, microcontroller program 130 may generate log entries 400 for registers $R_4$ (as first register 605 of fourth request 628) and $R_9$ (as last register 607 of fourth request 628).

Figure 7:
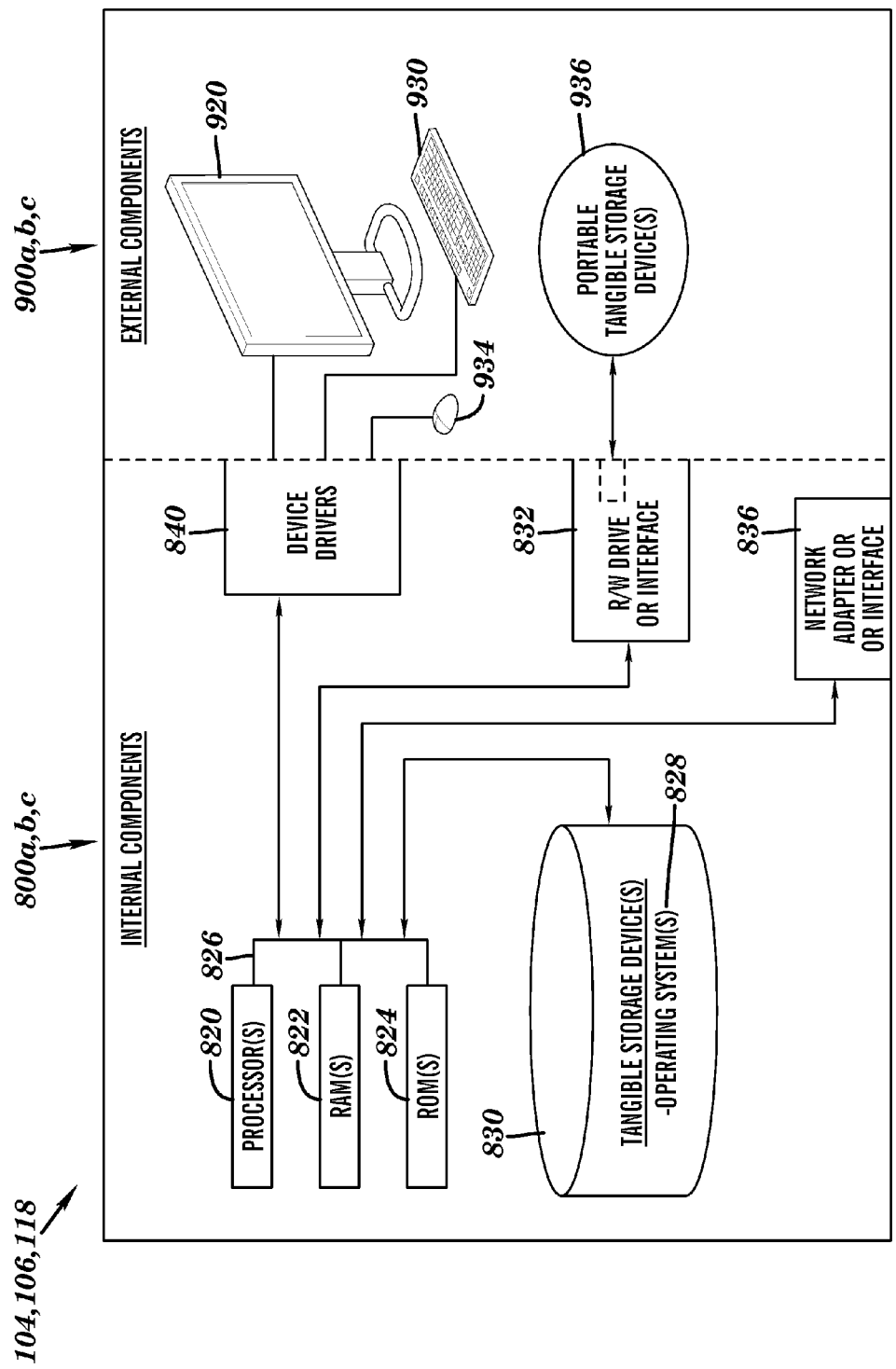
FIG. 7 is a block diagram of internal and external components of each of the computers of FIG. 1.

FIG. 7 is a block diagram of internal and external components of each of the computers of FIG. 1. Computers 104, 106, and 118 include respective sets of internal components 800a, b, c and external components 900a, b, c. Each of the sets of internal components 800a, b, c includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and microcontroller program 130 are stored on one or more of the computer-readable tangible storage devices 830 for execution by one or more of the processors 820 via one or more of the RAMs 822 (which typically include cache memory). In the embodiment illustrated in FIG. 7, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Each set of internal components 800a, b, c also includes a R/W drive or interface 832 to read from and write to one or more portable computer-readable tangible storage devices 828 such as a CD-ROM, DVD, memory stick, magnetic tape, magnetic disk, optical disk or semiconductor storage device. Embedded controller 129, which includes various components such as microcontroller program 130, can be stored on one or more of the portable computer-readable tangible storage devices 936, read via R/W drive or interface 832 and loaded into one or more computer-readable tangible storage devices 830.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the large computer server, partly on the large computer server, as a stand-alone software package, partly on the large computer server and partly on a remote computer or entirely on the remote computer or server. In the latter scenario, the remote computer may be connected to the large computer server through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for efficient logging in a control system, the method comprising:
   receiving register update requests to store data values in one or more of a plurality of primary registers;
   periodically identifying the most frequently updated primary registers of the plurality of primary registers;
   associating a shadow register with each of the identified most frequently updated primary registers;
   in response to receiving a register update request to store a data value in one of the most frequently updated primary registers:
   determining if the data value to store is different than the data value stored in the shadow register associated with the register to update;
   in response to determining that the data value to store is different than the data value stored in the shadow register associated with the register to update:
   storing the data value to store into the register to update;
   storing the data value to store into the shadow register associated with the register to update; and
   storing, in an event log file, a log entry corresponding to the register update request.

2. The method of claim 1, further comprising:
   in response to determining that the data value to store is not different than the data value stored in the shadow register associated with the register to update:
   not storing the data value to store into the register to update;
   not storing the data value to store into the shadow register associated with the register to update; and
   not storing, in an event log file, a log entry corresponding to the register update request.

3. The method of claim 1, further comprising:
   in response to receiving a register update request to store a data value in a primary register that is not one of the most frequently updated primary registers:
   storing the data value to store into the register to update; and
   storing, in an event log file, a log entry corresponding to the register update request.

4. The method of claim 1, further comprising:
   in response to receiving a request to upload the event log file, storing, in the event log file, a log entry corresponding to each data value stored in shadow registers.

5. The method of claim 1, wherein the log entry comprises a primary register identifier, a primary register value, and a time stamp value.

6. A computer system for efficient logging in a control system, the computer system comprising:
   one or more computer processors, one or more computer-readable storage media, and program instructions stored on one or more of the computer-readable storage media for execution by at least one of the one or more processors, the program instructions comprising:
   program instructions to receive register update requests to store data values in one or more of a plurality of primary registers;
   program instructions to periodically identify the most frequently updated primary registers of the plurality of primary registers;
   program instructions to associate a shadow register with each of the identified most frequently updated primary registers;
   program instructions, in response to receiving a register update request to store a data value in one of the most frequently updated primary registers, to:
   determine if the data value to store is different than the data value stored in the shadow register associated with the register to update;
   in response to determining that the data value to store is different than the data value stored in the shadow register associated with the register to update, to:
   store the data value to store into the register to update;
   store the data value to store into the shadow register associated with the register to update; and
   store, in an event log file, a log entry corresponding to the register update request.

7. The computer system of claim 6, further comprising:
   program instructions, in response to receiving a register update request to store a data value in a primary register that is not one of the most frequently updated primary registers, to:
   store the data value to store into the register to update; and store, in an event log file, a log entry corresponding to the register update request.

8. The computer system of claim 6, further comprising:
program instructions, in response to receiving a request to upload the event log file, to store, in the event log file, a log entry corresponding to each data value stored in shadow registers.

9. The computer system of claim 6, wherein the log entry comprises a primary register identifier, a primary register value, and a time stamp value.

10. A computer program product for efficient logging in a control system, the computer program product comprising:
one or more non-transitory computer-readable storage media and program instructions stored on the one or more non-transitory computer-readable storage media, the program instructions comprising:
program instructions to receive register update requests to store data values in one or more of a plurality of primary registers;
program instructions to periodically identify the most frequently updated primary registers of the plurality of primary registers;
program instructions to associate a shadow register with each of the identified most frequently updated primary registers;
program instructions, in response to receiving a register update request to store a data value in one of the most frequently updated primary registers, to:
determine if the data value to store is different than the data value stored in the shadow register associated with the register to update;
in response to determining that the data value to store is different than the data value stored in the shadow register associated with the register to update, to:
store the data value to store into the register to update;
store the data value to store into the shadow register associated with the register to update; and
store, in an event log file, a log entry corresponding to the register update request.

11. The computer program product of claim 10, further comprising:
program instructions, in response to receiving a register update request to store a data value in a primary register that is not one of the most frequently updated primary registers, to:
store the data value to store into the register to update; and
store, in an event log file, a log entry corresponding to the register update request.

12. The computer program product of claim 10, further comprising:
program instructions, in response to receiving a request to upload the event log file, to store, in the event log file, a log entry corresponding to each data value stored in shadow registers.

13. The computer program product of claim 10, wherein the log entry comprises a primary register identifier, a primary register value, and a time stamp value.

* * * * *